United States Patent
Igarashi

(10) Patent No.: US 12,018,371 B2
(45) Date of Patent: Jun. 25, 2024

(54) PROCESSING APPARATUS AND PROCESSING METHOD

(71) Applicant: Tokyo Electron Limited, Tokyo (JP)

(72) Inventor: Reita Igarashi, Oshu (JP)

(73) Assignee: TOKYO ELECTRON LIMITED, Tokyo (JP)

(*) Notice: Subject to any disclaimer, the term of this patent is extended or adjusted under 35 U.S.C. 154(b) by 192 days.

(21) Appl. No.: 17/584,848

(22) Filed: Jan. 26, 2022

(65) Prior Publication Data
US 2022/0243327 A1 Aug. 4, 2022

(30) Foreign Application Priority Data
Feb. 2, 2021 (JP) .................. 2021-015289

(51) Int. Cl.
*C23C 16/455* (2006.01)
*C23C 16/458* (2006.01)
*C23C 16/52* (2006.01)

(52) U.S. Cl.
CPC .. *C23C 16/45544* (2013.01); *C23C 16/45502* (2013.01); *C23C 16/4583* (2013.01); *C23C 16/52* (2013.01)

(58) Field of Classification Search
CPC .......... C23C 16/45544; C23C 16/4583; C23C 16/45502; C23C 16/45578; C23C 16/52
See application file for complete search history.

(56) References Cited

U.S. PATENT DOCUMENTS

| | | | |
|---|---|---|---|
| 2003/0111013 A1* | 6/2003 | Oosterlaken | C23C 16/45578 118/724 |
| 2004/0007180 A1* | 1/2004 | Yamasaki | C23C 16/4481 118/715 |
| 2006/0159847 A1* | 7/2006 | Porter | C23C 16/45512 427/248.1 |
| 2008/0075838 A1* | 3/2008 | Inoue | H01L 21/31662 118/715 |
| 2014/0256160 A1* | 9/2014 | Wada | H01L 21/02238 438/786 |
| 2015/0107517 A1* | 4/2015 | Hasebe | C23C 16/452 118/723 R |
| 2017/0029945 A1* | 2/2017 | Kamakura | C23C 16/402 |

FOREIGN PATENT DOCUMENTS

JP 2015-196839 A 11/2015

* cited by examiner

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A processing apparatus includes: a processing container having a substantially cylindrical shape; an injector provided to extend in a longitudinal direction along an inner side of an inner wall of the processing container and including a plurality of introduction ports into which a processing gas is introduced and a plurality of gas holes from which the processing gas introduced from the plurality of introduction ports is ejected into the processing container; and a controller configured to change a flow rate ratio of the processing gas to be introduced into the injector from the plurality of introduction ports.

13 Claims, 16 Drawing Sheets

PROCESSING APPARATUS AND PROCESSING METHOD

CROSS-REFERENCE TO RELATED APPLICATION

This application is based upon and claims the benefit of priority from Japanese Patent Application No. 2021-015289, filed on Feb. 2, 2021, the entire contents of which are incorporated herein by reference.

TECHNICAL FIELD

The present disclosure relates to a processing apparatus and a processing method.

BACKGROUND

A gas processing apparatus which includes a processing container accommodating a boat on which substrates are placed, and a gas pipe extending vertically along the inner wall of the processing container in the vicinity of the processing container and having a plurality of gas injection holes in the longitudinal direction thereof (see, for example, Patent Document 1) are known. In Patent Document 1, two gas inlets are provided in the gas pipe, and the injecting pressure of the gas injected through the plurality of gas injection holes is made uniform at each gas injection hole by causing the gas entering from each gas inlet to collide in the middle of the flow path in the gas pipe.

PRIOR ART DOCUMENT

Patent Document

Patent Document 1: Japanese Laid-Open Patent Publication No. 2015-196839

SUMMARY

According to one embodiment of the present disclosure, a processing apparatus includes: a processing container having a substantially cylindrical shape; an injector provided to extend in a longitudinal direction along an inner side of an inner wall of the processing container and including a plurality of introduction ports into which a processing gas is introduced and a plurality of gas holes from which the processing gas introduced from the plurality of introduction ports is ejected into the processing container; and a controller configured to change a flow rate ratio of the processing gas to be introduced into the injector from the plurality of introduction ports.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
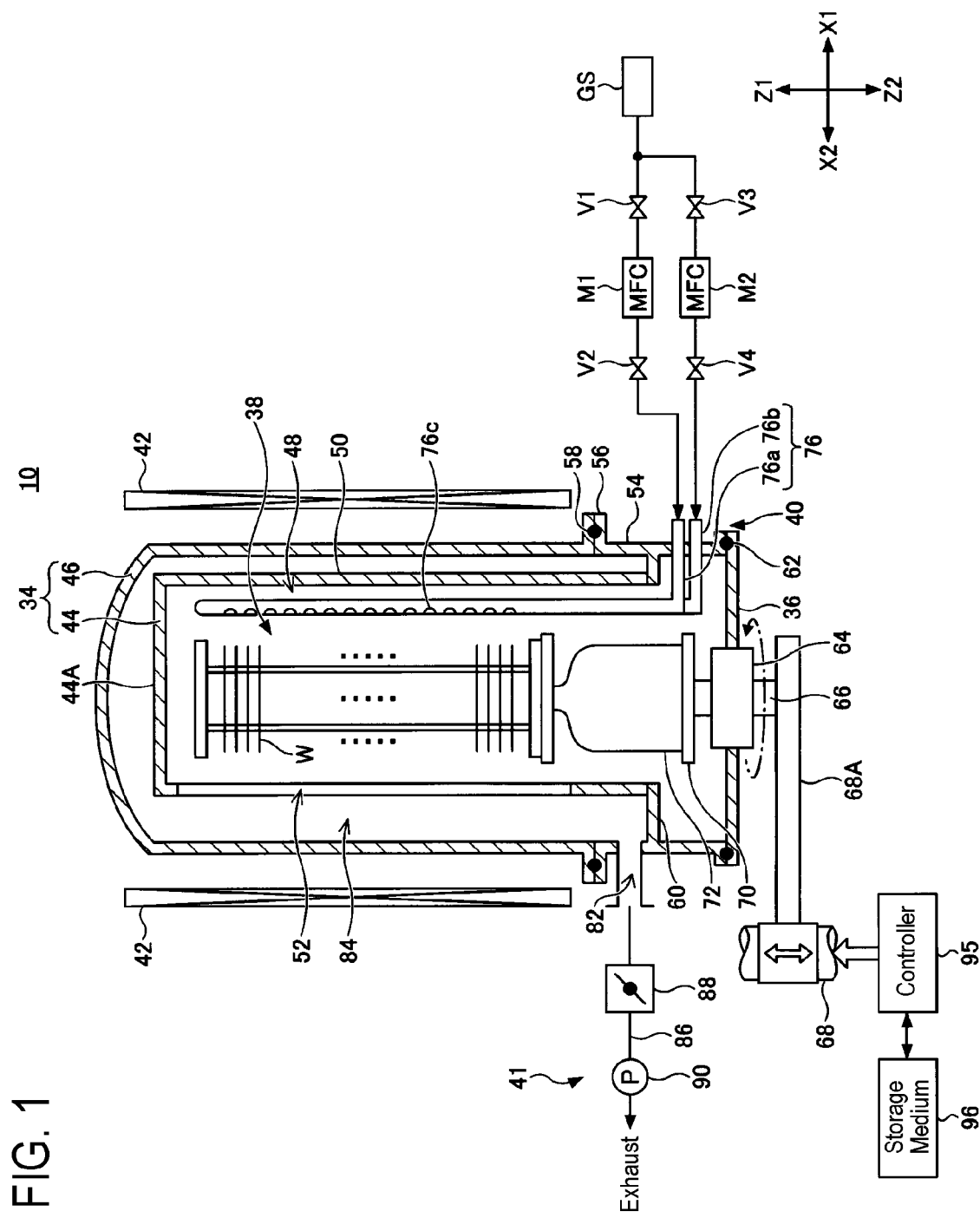
FIG. 1 is a schematic view illustrating an example of a processing apparatus according to an embodiment.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Processing Apparatus]

An example of a processing apparatus of an embodiment will be described with reference to FIG. 1. The processing apparatus of the embodiment is a batch-type vertical processing apparatus that is capable of forming a film on a plurality of substrates simultaneously and collectively. The processing apparatus of the embodiment is an apparatus for depositing a film on each substrate through, for example, chemical vapor deposition (CVD) or atomic layer deposition (ALD).

The processing apparatus 10 includes a processing container 34 configured to accommodate therein substrates W and a lid 36 configured to close an opening at the lower end of the processing container 34 on the Z2 side. The substrates W are, for example, semiconductor wafers such as silicon wafers. In addition, the processing apparatus 10 includes a boat 38 capable of being accommodated in the processing container 34 and configured to hold a plurality of substrates W at predetermined intervals, a gas supplier 40 configured to supply gas into the processing container 34, and an exhauster 41 configured to exhaust the gas within the processing container 34. A heater 42 configured to heat the interior of the processing container 34 is provided outside the processing container 34.

The processing container 34 includes a substantially cylindrical inner tube 44 having a lower open end on the Z2 side and a ceiling 44A on the Z1 side, and a substantially cylindrical outer tube 46 having a lower open end on the Z2 side and a ceiling on the Z1 side and configured to cover the exterior of the inner tube 44. The inner tube 44 and the outer tube 46 are formed of a heat-resistant material such as quartz, and are coaxially arranged in the Z1-Z2 direction to form a double-tube structure.

The ceiling 44A of the inner tube 44 is, for example, flat. Inside the inner tube 44, a nozzle accommodation portion 48 configured to accommodate therein an injector 76, which will be described later, is formed in the Z1-Z2 direction. A portion of the sidewall of the inner tube 44 includes a convex portion 50 formed to protrude outward in the X1 direction. The interior of the formed convex portion 50 may be used as the nozzle accommodation portion 48. In the sidewall on the X2 side opposite to the inner tube 44 facing the nozzle accommodation portion 48, a rectangular opening 52 having a predetermined width is formed in the Z1-Z2 direction.

The opening 52 is an exhaust port configured to evacuate the interior of the inner tube 44. The length of the opening 52 in the Z1-Z2 direction is equal to or longer than the length of the boat 38. That is, at the upper end on the Z1 side, the opening 52 is formed to be longer on the Z1 side than the position corresponding to the upper end of the boat 38 and, at the lower end on the Z2 side, the opening 52 is formed to be longer on the Z2 side than the position corresponding to the lower end of the boat 38.

The lower end of the processing container 34 on the Z2 side is supported by a substantially cylindrical manifold 54 formed of, for example, stainless steel. A flange 56 is formed at the upper end of the manifold 54 on the Z1 side, and the lower end of the outer tube 46 on the Z2 side is connected to the flange 56. A seal member 58 such as an O-ring is provided between the flange 56 and the outer tube 46, and the flange 56 and the outer tube 46 are connected to each other via the seal member 58. In this embodiment, a region surrounded by the processing container 34, the manifold 54, and the lid 36 inside the processing container 34 may be referred to as the interior of the processing container.

An annular support portion 60 is provided on the inner wall on the Z1 side, which is the upper portion of the manifold 54, and the lower end of the inner tube 44 on the Z2 side is installed on the support portion 60 so as to be supported thereon. The lid 36 is installed on the opening at the lower end of the manifold 54 on the Z2 side via a seal member 62 such as an O-ring, thereby hermetically blocking the opening of the processing container 34 at the lower end on the Z2 side, that is, the opening of the manifold 54. The lid 36 is formed of, for example, stainless steel.

Through the central portion of the lid 36, a rotary shaft 66 is provided via a magnetic fluid seal 64. A lower portion of the rotary shaft 66 on the Z2 side is rotatably supported on an arm 68A of an elevating part 68 configured as a boat elevator.

A rotary plate 70 is provided at the upper end of the rotary shaft 66 on the Z1 side. The boat 38 that holds the substrates W is placed on the rotary plate 70 via a quartz heat-retaining stage 72. Accordingly, by raising and lowering the arm 68A by the elevating part 68, the lid 36 and the boat 38 move upward and downward integrally, so that the boat 38 can be put in and taken out of the processing container 34.

The gas supplier 40 is provided in the manifold 54 and can supply the processing gas to the inside of the inner tube 44. The processing gas includes, for example, a raw-material gas and an additive gas. The raw-material gas is a gas for depositing a film on a substrate W, and may be a silicon-containing gas, such as monosilane ($SiH_4$) or disilane ($Si_2H_6$). The additive gas is a gas for diluting the raw-material gas, and may be an inert gas such as nitrogen ($N_2$) or argon (Ar). The gas supplier 40 includes one injector 76 made of quartz. However, the gas supplier 40 may have another injector.

The injector 76 includes two upright portions 76a and 76b. The two upright portions 76a and 76b are bent and connected in a direction approaching each other at the end portions on the Z1 direction side, and the end portions on the Z2 direction side are bent toward the X1 side in an L shape and penetrate the manifold 54 to be supported.

A plurality of gas holes 76c are formed in one of the upright portions 76a of the injector 76 at a predetermined interval, and a processing gas is ejected from each gas hole 76c in a substantially horizontal direction. The predetermined interval is, for example, the same as the interval of the substrates W supported by the boat 38. The position of each of the gas holes 76c of the upright portion 76a in the Z1-Z2 direction is located at an intermediate position between adjacent substrates W in the Z1-Z2 direction so that the processing gas can be efficiently supplied to spaces between the substrates W. However, the predetermined intervals between the respective gas holes 76c are not limited to the above. A gas hole may be provided for each of the plurality of substrates W.

In addition, the position of each gas hole 76c is not limited to the intermediate position between adjacent substrates W, and each gas hole 76c may be provided at any position such as the same height as a substrate W. In addition, the orientation of each gas hole 76c may be provided in any direction such as toward the center of the substrate W, toward the outer periphery of the substrate W, or toward the inner pipe 44.

On the outer peripheral side of the outer tube 46, a substantially cylindrical heater 42 is provided to surround the perimeter of the outer tube 46. By the heater 42, the substrates W accommodated in the processing container 34 and the gas in the upright portions 76a and 76b of the injector 76 can be heated.

A processing gas source GS is connected to one upright portion 76a of the injector 76 via a valve V1, a flow rate controller M1, and a valve V2. The processing gas source GS is connected to the other upright portion 76b of the injector 76 via a valve V3, a flow rate controller M2, and a valve V4. That is, the upright portions 76a and 76b are connected to the same processing gas source GS. However, the upright portion 76b may be connected to a processing gas source different from that of the upright portion 76a.

In the injector 76, the processing gas from the processing gas source GS is introduced into the upright portions 76a and 76b via the valves V1 to V4 under the control of the flow rate controllers M1 and M2 and is ejected to the interior of the inner tube 44 of the processing container 34 from the plurality of gas holes 76c provided in the upright portion 76a.

Since an exhaust port 82 is provided in the upper sidewall of the manifold 54 on the Z1 side and above the support portion 60, the gas inside the inner tube 44 is exhausted from the opening 52 through a space 84 between the inner tube 44 and the outer tube 46. The exhauster 41 is connected to the exhaust port 82. The exhauster 41 is provided with a pressure adjustment valve 88, an exhaust passage 86, and a vacuum pump 90 in this order from the exhaust port 82, and is capable of evacuating the interior of the processing container 34.

In the present embodiment, the plurality of substrates W are provided inside the inner tube 44 in the Z1-Z2 direction perpendicular to wafer surfaces to be the substrate surfaces. The processing gas is ejected to the spaces between the substrates W from the plurality of gas holes 76c formed in the upright portion 76a of the injector 76. The ejected processing gas passes through the spaces between the substrates W so that the substrates W are processed. However, the gas that does not contribute to the processing goes out of the inner tube 44 through the opening 52 on the X2 side and passes through the space 84 between the inner tube 44 and the outer tube 46, to be exhausted from the exhaust port 82.

The overall operation of the processing apparatus 10 is controlled by a controller 95 such as a computer. A computer program that executes the overall operation of the processing apparatus 10 may be stored in a storage medium 96. The storage medium 96 may be, for example, a flexible disk, a compact disk, a hard disk, a flash memory, or a DVD.

In the present embodiment, the controller 95 controls the valves V1 to V4 and the flow rate controllers M1 and M2 while the substrate W is being subjected to a predetermined process (e.g., a film forming process) to change a flow rate ratio of the processing gas to be introduced into the upright portion 76b to the processing gas to be introduced into the upright portion 76a.

When a silicon-containing gas as a raw-material gas is introduced into the injector, the silicon-containing gas is heated by the heater while flowing inside the injector from the upstream toward the downstream. Therefore, the silicon-containing gas ejected from the gas hole located upstream of the gas flow and the silicon-containing gas ejected from the gas hole located downstream differ in the heating time in the injector. As a result, since the flow rate and the thermal decomposition rate differ between the silicon-containing gas ejected from gas holes located upstream of the gas flow and the silicon-containing gas ejected from gas holes located downstream of the gas flow, variation in the uniformity of film characteristics of formed silicon films occurs between the substrates W.

In the present embodiment, since the injector 76 has a plurality of introduction ports and the silicon-containing gas is introduced into the injector 76 through the plurality of introduction ports, it is possible to change the positional relationship between the upstream and the downstream with respect to the gas holes 76c. This makes it possible to change the distribution of flow rates or thermal decomposition rates of the silicon-containing gas ejected toward the substrates W. As a result, it is possible to adjust the distribution of film characteristics of the silicon films to be formed between the substrates W.

[Injector]

An injector 200, which is an example of the injector 76 provided in the processing apparatus 10 of FIG. 1, will be described with reference to FIG. 2, The injector 200 includes a first upright portion 210 and a second upright portion 220. The first upright portion 210 and the second upright portion 220 have the same length and are connected to each other at the upper portions thereof.

The first upright portion 210 extends along the inner side of the inner wall of the processing container 34. In the first upright portion 210, an upper portion is bent toward the second upright portion 220 to form a connection portion 211 to be connected to the second upright portion 220, and a lower portion opens to form an introduction port 212 into which a processing gas is introduced. The first upright portion 210 has the same inner diameter from the lower portion to the upper portion.

The first upright portion 210 includes a plurality of gas holes 213 formed at intervals along the longitudinal direction. The plurality of gas holes 213 are oriented toward the center of the processing container 34. As a result, the plurality of gas holes 213 eject the processing gas introduced from the introduction port 212 of the first upright portion 210 and an introduction port 222 (to be described later) of the second upright portion 220 substantially horizontally toward the center of the processing container 34. However, the plurality of gas holes 213 may be oriented in a direction different from the center side of the processing container 34, for example, toward the inner wall of the processing container 34.

The second upright portion 220 extends along the inner side of the inner wall of the processing container 34. The second upright portion 220 is provided at a position adjacent to the first upright portion 210 in the circumferential direction of the processing container 34. Alternatively, the second upright portion 220 may be provided at a position adjacent to the first upright portion 210 in the radial direction of the processing container 34. In the second upright portion 220, an upper portion is bent toward the first upright portion 210 to form a connection portion 221 to be connected to the first upright portion 210, and a lower portion opens to form an introduction port 222 into which the processing gas is introduced.

The second upright portion 220 has the same inner diameter from the lower portion to the upper portion. The inner diameter of the second upright portion 220 is the same as the inner diameter of the first upright portion 210.

In the injector 200, it is possible to adjust the distribution of flow rates or thermal decomposition rates of the processing gas in the vertical direction by changing a flow rate ratio of the processing gas introduced into the injector 200 from the introduction ports 212 to the processing gas introduced into the injector 200 from the introduction ports 222. This makes it possible to adjust the inter-plane uniformity of the gas supply to the substrates W.

For example, by reducing the flow rate ratio of the processing gas introduced into the first upright portion 210 from the introduction port 212 to the processing gas introduced into the second upright portion 220 from the introduction port 222, it is possible to shift the position where the flow velocity is slow from the upper portion to the lower portion of the first upright portion 210. Since the residence time of the processing gas becomes long at the position where the flow velocity is slow, thermal decomposition of the processing gas is promoted. As a result, it is possible to shift the position where the thermal decomposition rate is high from the upper portion to the lower portion of the first upright portion 210.

Figure 3:
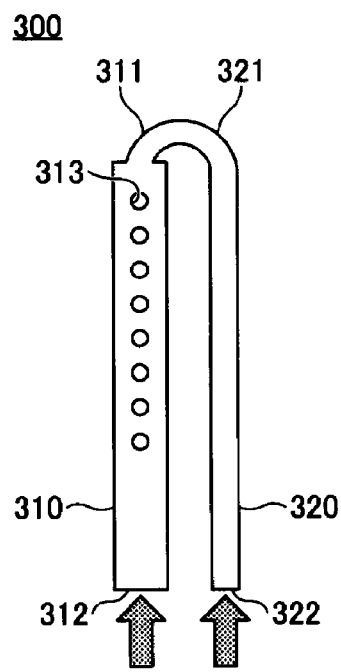
FIG. 3 is a view illustrating a first modification of the injector of the processing apparatus of FIG. 1.

With reference to FIG. 3, an injector 300, which is a first modification of the injector 76 provided in the processing apparatus 10 of FIG. 1, will be described. The injector 300 differs from the injector 200 in that the inner diameters of a first upright portion 310 and a second upright portion 320 differ from each other.

The injector 300 includes the first upright portion 310 and the second upright portion 320. The first upright portion 310 and the second upright portion 320 have the same length and are connected to each other at upper portions thereof.

The first upright portion 310 extends along the inner side of the inner wall of the processing container 34. In the first upright portion 310, an upper portion is bent toward the second upright portion 320 to form a connection portion 311 to be connected to the second upright portion 320, and a lower portion opens to form an introduction port 312 into which a processing gas is introduced. The inner diameter of the first upright portion 310 is reduced in the connection portion 311.

The first upright portion 310 includes a plurality of gas holes 313 formed at intervals along the longitudinal direction. The plurality of gas holes 313 are oriented toward the center of the processing container 34. As a result, the plurality of gas holes 313 eject the processing gas introduced from the introduction port 312 of the first upright portion 310 and an introduction port 322 (to be described later) of the second upright portion 320 substantially horizontally toward the center of the processing container 34. However, the plurality of gas holes 313 may be oriented in a direction different from the center side of the processing container 34, for example, toward the inner wall of the processing container 34.

The second upright portion 320 extends along the inner side of the inner wall of the processing container 34. The second upright portion 320 is provided at a position adjacent to the first upright portion 310 in the circumferential direction of the processing container 34. Alternatively, the second upright portion 320 may be provided at a position adjacent to the first upright portion 310 in the radial direction of the processing container 34. In the second upright portion 320, an upper portion is bent toward the first upright portion 310 to form a connection portion 321 to be connected to the first upright portion 310, and a lower portion opens to form an introduction port 322 into which the processing gas is introduced.

The second upright portion 320 has the same inner diameter from the lower portion to the upper portion. The inner diameter of the second upright portion 320 is the same as the inner diameter of the connection portion 311 of the first upright portion 310. In other words, the inner diameter of the second upright portion 320 is smaller than the inner diameter of the portion of the first upright portion 310 in which the plurality of gas holes 313 are formed.

In the injector 300, it is possible to adjust the distribution of flow rates or thermal decomposition rates of the processing gas in the vertical direction by changing a flow rate ratio of the processing gas introduced into the injector 300 from the introduction port 312 to the processing gas introduced into the injector 300 from the introduction port 322. This makes it possible to adjust the inter-plane uniformity of the gas supply to the substrates W.

For example, by reducing the flow rate ratio of the processing gas introduced into the first upright portion 310 from the introduction port 312 to the processing gas introduced into the second upright portion 320 from the introduction port 322, it is possible to shift the position where the flow velocity is slow from the upper portion to the lower portion of the first upright portion 310. Since the residence time of the processing gas becomes long at the position where the flow velocity is slow, thermal decomposition of the processing gas is promoted. As a result, it is possible to shift the position where the thermal decomposition rate is high from the upper portion to the lower portion of the first upright portion 310.

Figure 4:
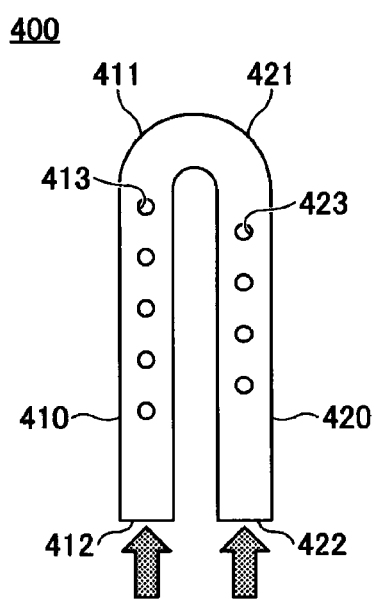
FIG. 4 is a view illustrating a second modification of the injector of the processing apparatus of FIG. 1.

With reference to FIG. 4, an injector 400, which is a second modification of the injector 76 provided in the processing apparatus 10 of FIG. 1, will be described. The injector 400 differs from the injector 200 in that a plurality of gas holes 413 and 423 are provided in both a first upright portion 410 and a second upright portion 420.

The injector 400 includes the first upright portion 410 and the second upright portion 420. The first upright portion 410 and the second upright portion 420 have the same length and are connected to each other at upper portions thereof.

The first upright portion 410 extends along the inner side of the inner wall of the processing container 34. In the first upright portion 410, an upper portion is bent toward the second upright portion 420 to form a connection portion 411 to be connected to the second upright portion 420, and a lower portion opens to form an introduction port 412 into which a processing gas is introduced. The first upright portion 410 has the same inner diameter from the lower portion to the upper portion.

The first upright portion 410 includes a plurality of gas holes 413 formed at intervals along the longitudinal direction. The plurality of gas holes 413 are oriented toward the center of the processing container 34. As a result, the plurality of gas holes 413 eject the processing gas introduced from the introduction port 412 of the first upright portion 410 and an introduction port 422 (to be described later) of the second upright portion 420 substantially horizontally toward the center of the processing container 34. However, the plurality of gas holes 413 may be oriented in a direction different from the center side of the processing container 34, for example, toward the inner wall of the processing container 34.

The second upright portion 420 extends along the inner side of the inner wall of the processing container 34. The second upright portion 420 is provided at a position adjacent to the first upright portion 410 in the circumferential direction of the processing container 34. Alternatively, the second upright portion 420 may be provided at a position adjacent to the first upright portion 410 in the radial direction of the processing container 34. In the second upright portion 420, an upper portion is bent toward the first upright portion 410 to form a connection portion 421 to be connected to the first upright portion 410, and a lower portion opens to form an introduction port 422 into which the processing gas is introduced.

The second upright portion 420 has the same inner diameter from the lower portion to the upper portion. The inner diameter of the second upright portion 420 is the same as the inner diameter of the first upright portion 410. However, the inner diameter of the second upright portion 420 may differ from the inner diameter of the first upright portion 410.

The second upright portion 420 includes a plurality of gas holes 423 formed at intervals along the longitudinal direction. The plurality of gas holes 423 are oriented toward the same side as the plurality of gas holes 413, that is, toward the center of the processing container 34. As a result, the plurality of gas holes 423 eject the processing gas introduced from the introduction port 412 of the first upright portion 410 and an introduction port 422 of the second upright portion 420 substantially horizontally toward the center of the processing container 34. However, the plurality of gas holes 423 may be oriented in a direction different from the center side of the processing container 34, for example, toward the inner wall of the processing container 34. Alternatively, the plurality of gas holes 423 may be oriented in a direction different from that of the plurality of gas holes 413. Each of the plurality of gas holes 423 is provided at an intermediate position between two adjacent gas holes 413 in the vertical direction. Alternatively, the plurality of gas holes 423 may be provided at the same positions as the plurality of gas holes 413 in the vertical direction.

In the injector 400, it is possible to adjust the distribution of flow rates or thermal decomposition rates of the processing gas in the vertical direction by changing a flow rate ratio of the processing gas introduced into the injector 400 from the introduction port 412 to the processing gas introduced into the injector 400 from the introduction port 422. This makes it possible to adjust the inter-plane uniformity of the gas supply to the substrates W.

Figure 5:
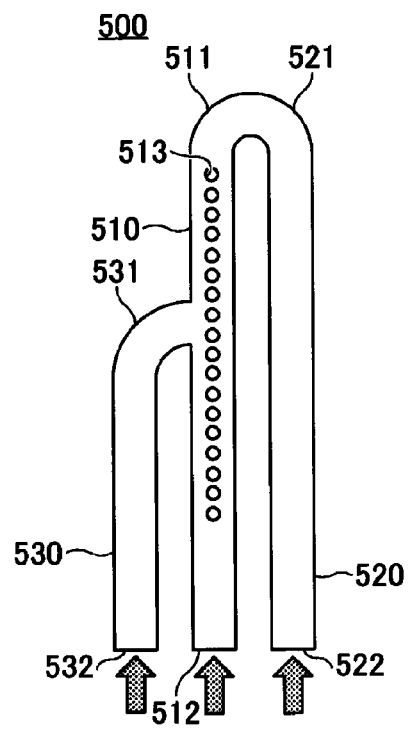
FIG. 5 is a view illustrating a third modification of the injector of the processing apparatus of FIG. 1.

With reference to FIG. 5, an injector 500, which is a third modification of the injector 76 provided in the processing apparatus 10 of FIG. 1, will be described. The injector 500 differs from the injector 200 in that the injector 500 includes a third upright portion 530 connected to the middle of the first upright portion 510.

The injector 500 includes the first upright portion 510, a second upright portion 520, and the third upright portion 530. The first upright portion 510 and the second upright portion 520 have the same length and are connected to each other at upper portions thereof. The third upright portion 530 has a length smaller than the first upright portion 510 and is connected to the middle of the first upright portion 510.

The first upright portion 510 extends along the inner side of the inner wall of the processing container 34. In the first upright portion 510, an upper portion is bent toward the second upright portion 520 to form a connection portion 511 to be connected to the second upright portion 520, and a lower portion opens to form an introduction port 512 into which a processing gas is introduced. The first upright portion 510 has the same inner diameter from the lower portion to the upper portion.

The first upright portion 510 includes a plurality of gas holes 513 formed at intervals along the longitudinal direction. The plurality of gas holes 513 are oriented toward the center of the processing container 34. As a result, the plurality of gas holes 513 eject the processing gas introduced from the introduction port 512 of the first upright portion 510, an introduction port 522 (to be described later) of the second upright portion 520, and an introduction port 532 (to be described later) of the third upright portion 530 substantially horizontally toward the center of the processing container 34. However, the plurality of gas holes 513 may be oriented in a direction different from the center side of the processing container 34, for example, toward the inner wall of the processing container 34.

The second upright portion 520 extends along the inner side of the inner wall of the processing container 34. The second upright portion 520 is provided at a position adjacent to the first upright portion 510 in the circumferential direction of the processing container 34. Alternatively, the second upright portion 520 may be provided at a position adjacent to the first upright portion 510 in the radial direction of the processing container 34. In the second upright portion 520, an upper portion is bent toward the first upright portion 510 to form a connection portion 521 to be connected to the first upright portion 510, and a lower portion opens to form an introduction port 522 into which the processing gas is introduced.

The second upright portion 520 has the same inner diameter from the lower portion to the upper portion. The inner diameter of the second upright portion 520 is the same as the inner diameter of the first upright portion 510. However, the inner diameter of the second upright portion 520 may differ from the inner diameter of the first upright portion 510.

The third upright portion 530 extends along the inner side of the inner wall of the processing container 34. The third upright portion 530 is provided at a position adjacent to the first upright portion 510 on a side different from the second upright portion 520 in the circumferential direction of the processing container 34. In other words, the third upright portion 530, the first upright portion 510, and the second upright portion 520 are provided in this order along the circumferential direction of the processing container 34. However, the third upright portion 530 may be provided at a position adjacent to the first upright portion 510 in the radial direction of the processing container 34.

In the third upright portion 530, an upper portion is bent toward the first upright portion 510 to form a connection portion 531 to be connected to the first upright portion 510, and a lower portion opens to form an introduction port 532 into which the processing gas is introduced. The third upright portion 530 is connected to an intermediate position in the vertical direction of the first upright portion 510. Alternatively, the third upright portion 530 may be connected to the upper side (the connection portion 511 side) of the intermediate position in the vertical direction of the first upright portion 510, or may be connected to the lower side (the introduction port 512 side) of the intermediate position in the vertical direction of the first upright portion 510.

The third upright portion 530 has the same inner diameter from the lower portion to the upper portion. The inner diameter of the third upright portion 530 is the same as the inner diameter of the first upright portion 510. However, the inner diameter of the third upright portion 530 may differ from the inner diameter of the first upright portion 510.

In the injector 500, it is possible to adjust the distribution of flow rates or thermal decomposition rates of the processing gas in the vertical direction by changing a flow rate ratio of the processing gas introduced into the injector 500 from the introduction port 512, the processing gas introduced into the injector 500 from the introduction port 522, and the processing gas introduced into the injector 300 from the introduction port 532. This makes it possible to adjust the inter-plane uniformity of the gas supply to the substrates W.

For example, by reducing the flow rate ratio of the processing gas introduced into the first upright portion 510 from the introduction port 512 to the processing gas introduced into the second upright portion 520 from the introduction port 522, it is possible to shift the position where the flow velocity is slow from the upper portion to the lower portion of the first upright portion 510. Since the residence time of the processing gas becomes long at the position where the flow velocity is slow, thermal decomposition of the processing gas is promoted. As a result, it is possible to shift the position where the thermal decomposition rate is high from the upper portion to the lower portion of the first upright portion 510.

[Analysis Results]

With reference to FIGS. 6 to 19, results of analysis by computational fluid dynamics (CFD) (whereinafter, referred to as "CFD analysis") performed to confirm the effects of the injector 76 of the embodiment, will be described.

In the CFD analysis, it was analyzed how the mole fraction of reaction active species ($SiH_2$) and the mass flow rate of a raw-material gas ($Si_2H_6$) change when the flow rate ratio of the raw-material gas introduced into the injector from multiple introduction ports is changed. The mole fraction of the reaction active species ($SiH_2$) was analyzed in consideration of the fact that the thickness of a film deposited on a substrate W is associated with the concentration of reaction active species ($SiH_2$) generated by the thermal decomposition of a raw-material gas ($Si_2H_6$).

(Analysis A)

Figure 2:
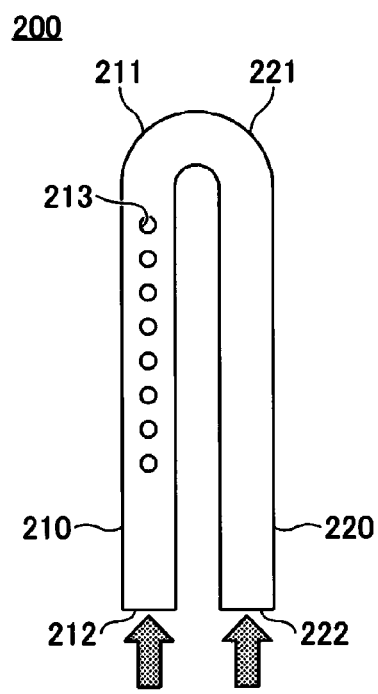
FIG. 2 is a view illustrating an example of an injector of the processing apparatus of FIG. 1.

First, using the injector 200 of FIG. 2, the mole fraction of $SiH_2$ and the mass flow rate of $Si_2H_6$ when the flow rate ratio of $Si_2H_6$ introduced into the injector 200 from the introduction ports 212 and 222 was changed were analyzed. In this analysis, the inner diameter of the injector 200 was set to 13.5 mm, the hole diameter of the gas holes 313 was set to 0.5 mm, the number of gas holes 313 was set to 61, and the total flow rate of $Si_2H_6$ was set to 500 sccm. In addition, the flow rate ratio X/Y of the flow rate X of $Si_2H_6$ introduced into the injector 200 from the introduction port 212 and the flow rate Y of $Si_2H_6$ introduced into the injector 200 from the introduction port 222 was changed as follows.

X/Y=450/50, 420/80, 400/100, 300/200, 250/250, 200/300, 100/400, 80/420, 50/450 (where, the unit is sccm for all values)

Figure 6:
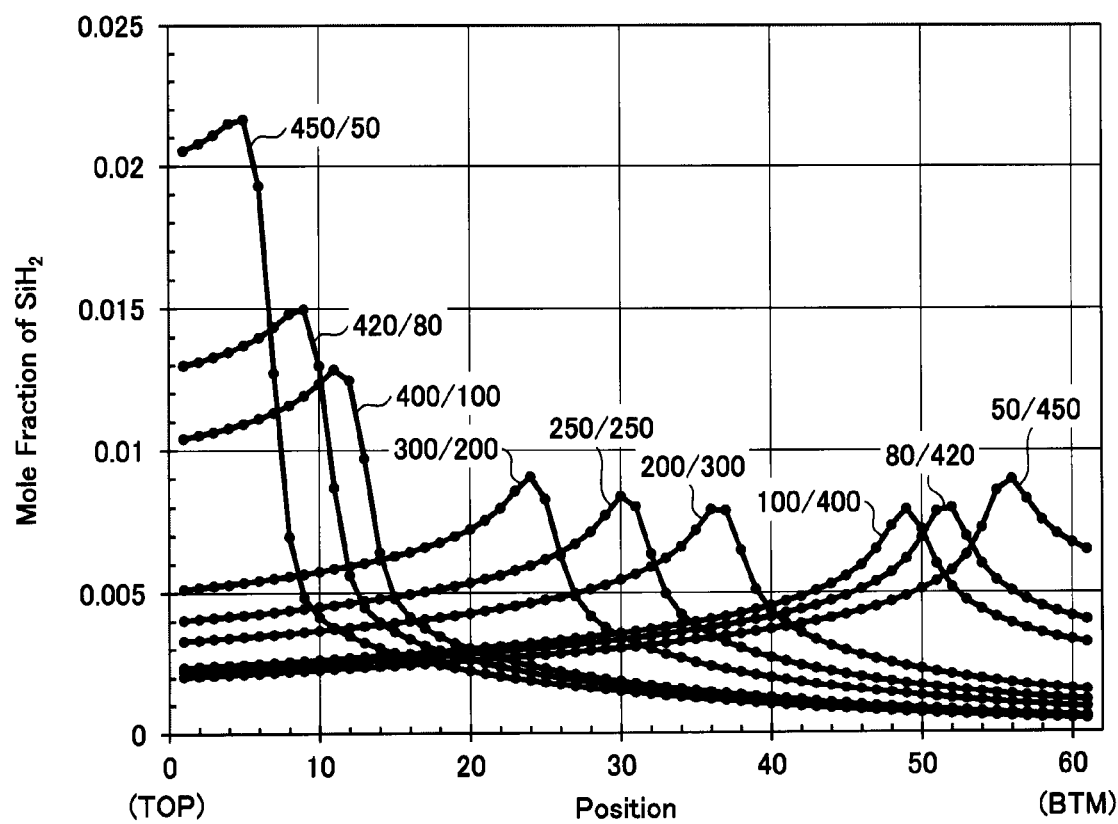
FIG. 6 is a diagram showing analysis results of the mole fraction of $SiH_2$ when the injector (inner diameter: 13.5 mm) of FIG. 2 was used.

FIG. 6 is a diagram showing analysis results of the mole fraction of $SiH_2$ when the injector 200 (inner diameter: 13.5 mm) of FIG. 2 was used. In FIG. 6, the horizontal axis represents the position of the gas hole 213, and the vertical axis represents the mole fraction of $SiH_2$. The position of the gas hole 213 indicates at which position the gas hole is arranged from the top side of the first upright portion 210.

As shown in FIG. 6, it can be seen that the peak position of the mole fraction of $SiH_2$ is shifted when the flow rate ratio X/Y is changed. Specifically, it can be seen that as the flow rate ratio X/Y is made smaller, the peak position of the mole fraction of $SiH_2$ is shifted from the upper portion (TOP) to the lower portion (BTM) of the injector 200.

As shown in FIG. 6, when the flow rate ratio X/Y is large, the mole fraction of $SiH_2$ at a position above the peak position (TOP side) is higher than the mole fraction of $SiH_2$ at a position below the peak position (BTM side). That is, it can be seen that, when the flow rate ratio X/Y is large, the waveform of the mole fraction of $SiH_2$ does not have symmetry.

Figure 7:
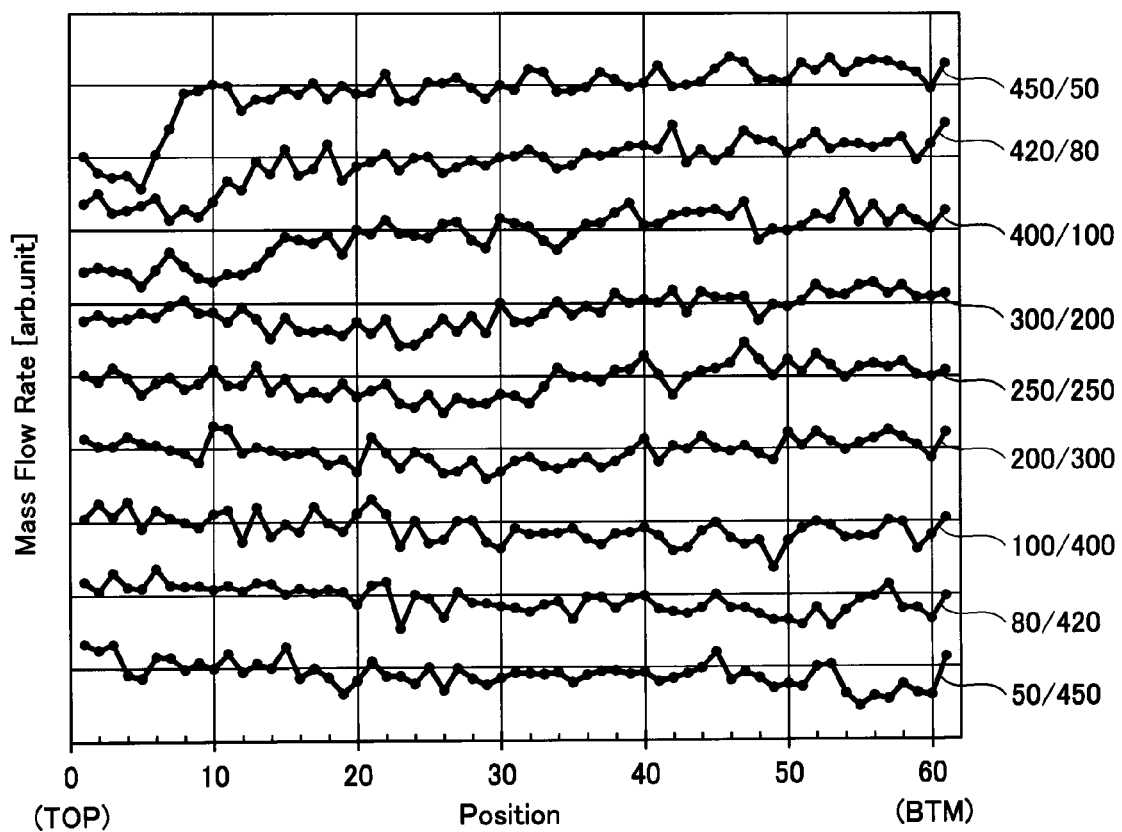
FIG. 7 is a diagram showing analysis results of a mass flow rate when the injector of FIG. 2 (inner diameter: 13.5 mm) was used.

FIG. 7 is a diagram showing analysis results of a mass flow rate when the injector 200 of FIG. 2 (inner diameter: 13.5 mm) was used. In FIG. 7, the horizontal axis represents the position of the gas hole 213, and the vertical axis represents the mass flow rate [arb.unit] of $Si_2H_6$. The position of the gas hole 213 indicates at which position the gas hole is arranged from the top side of the first upright portion 210. The mass flow rate of $Si_2H_6$ is shown in arbitrary units such that the results between multiple different flow rate ratios X/Y do not overlap.

As shown in FIG. 7, it can be seen that, even if the flow rate ratio X/Y is changed, the mass flow rate of $Si_2H_6$ hardly changes and is substantially constant at all positions in the vertical direction of the injector 200.

From the results of FIGS. 6 and 7 described above, it was shown that, by using the injector 200 (inner diameter: 13.5 mm), it is possible to make the mass flow distribution of $Si_2H_6$ in the vertical direction substantially constant, and to shift the peak position of the thermal decomposition rate of $Si_2H_6$ in the vertical direction.

(Analysis B)

Next, using the injector 300 of FIG. 3, the mole fraction of $SiH_2$ and the mass flow rate of $Si_2H_6$ when the flow rate ratio of $Si_2H_6$ introduced into the injector 300 from the introduction ports 312 and 322 was changed were analyzed. In this analysis, the inner diameter of the first upright portion 310 was set to 13.5 mm, the inner diameter of the second upright portion 320 was set to 5.4 mm, the hole diameter of the gas holes 313 was set to 0.5 mm, the number of gas holes 313 was set to 61, and the total flow rate of $Si_2H_6$ was set to 500 sccm. In addition, the flow rate ratio X/Y of the flow rate X of $Si_2H_6$ introduced into the injector 300 from the introduction port 312 to the flow rate Y of $Si_2H_6$ introduced into the injector 300 from the introduction port 322 was changed as follows.

X/Y=490/10, 420/80, 250/250, 80/420, 10/490 (where, the unit is sccm for all values)

Figure 8:
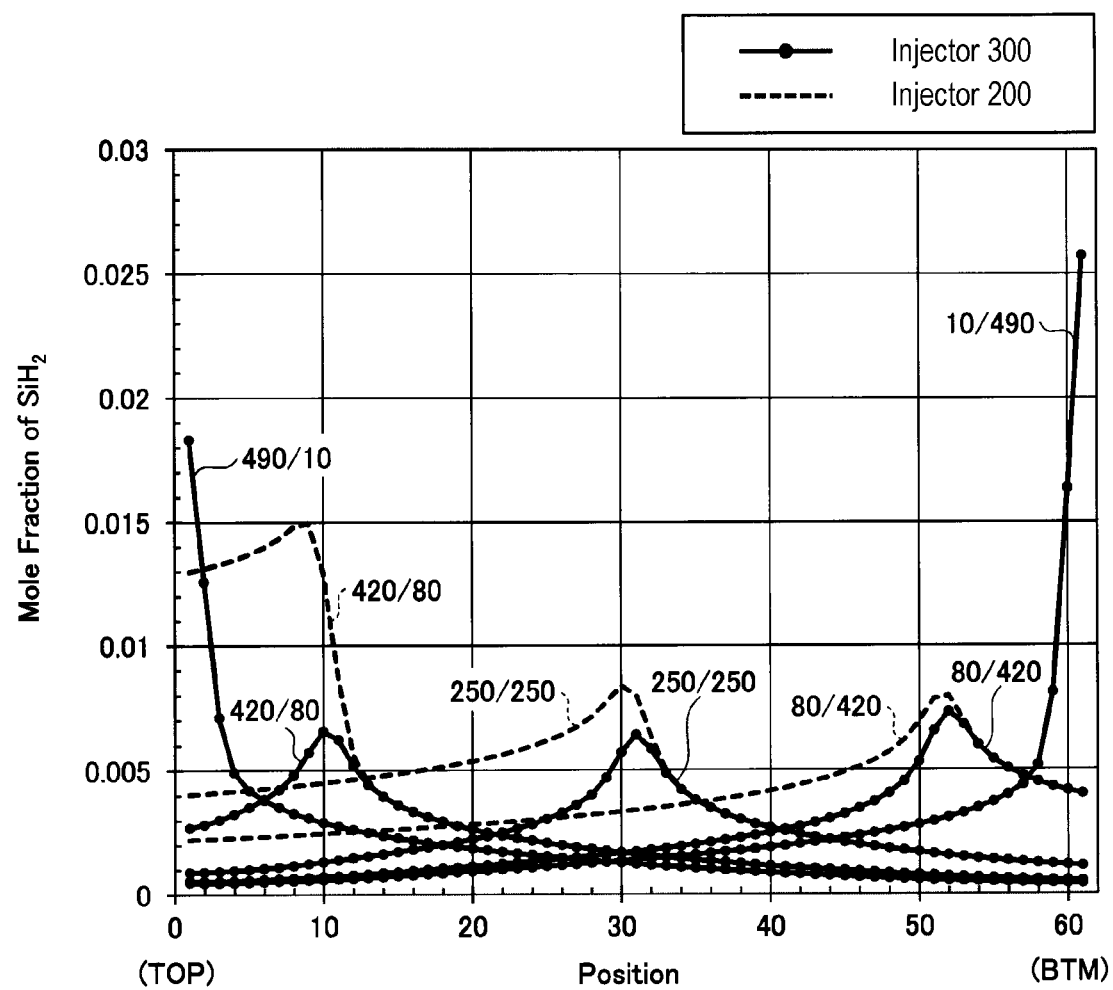
FIG. 8 is a diagram showing analysis results of the mole fraction of $SiH_2$ when the injector of FIG. 3 was used.

FIG. 8 is a diagram showing analysis results of the mole fraction of $SiH_2$ when the injector 300 of FIG. 3 was used. In FIG. 8, the horizontal axis represents the position of the gas hole 313, and the vertical axis represents the mole fraction of $SiH_2$. The position of the gas hole 313 indicates at which position the gas hole is arranged from the top side of the first upright portion 310. In addition, FIG. 8 also shows the analysis results of the mole fraction of $SiH_2$ when the injector 200 (inner diameter: 13.5 mm) of FIG. 2 was used for comparison. In FIG. 8, the results of the injector 300 are indicated by solid lines, and the results of the injector 200 (inner diameter: 13.5 mm) are indicated by broken lines.

As shown in FIG. 8, it can be seen that the peak position of the mole fraction of $SiH_2$ is shifted when the flow rate ratio X/Y is changed. Specifically, it can be seen that as the flow rate ratio X/Y is made smaller, the peak position of the mole fraction of $SiH_2$ is shifted from the upper portion (TOP) to the lower portion (BTM) of the injector 300.

In addition, as shown in FIG. 8, it can be seen that, compared to the case where the injector 200 was used, when the injector 300 was used, the mole fraction of $SiH_2$ at a position above the peak position (TOP side) becomes smaller, and the mole fraction waveforms of $SiH_2$ have symmetry.

Figure 9:
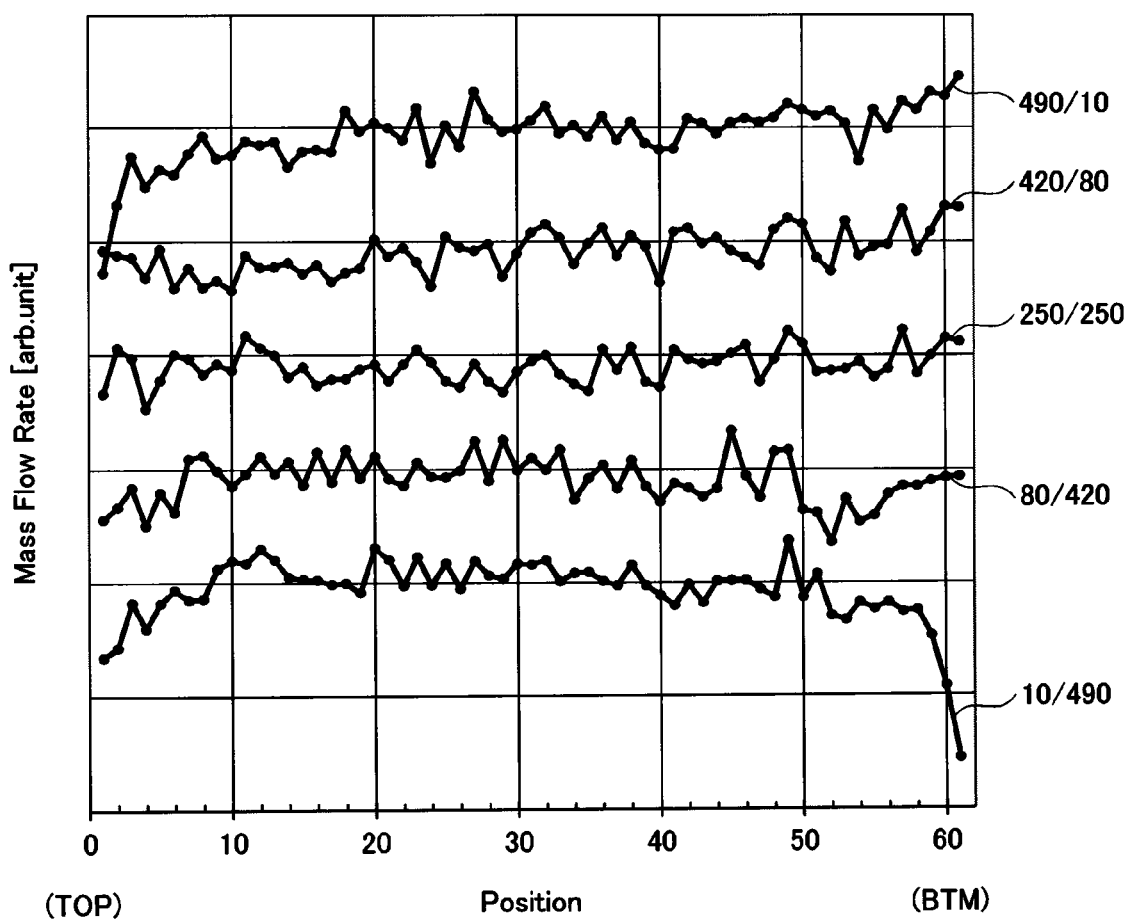
FIG. 9 is a diagram showing analysis results of a mass flow rate when the injector of FIG. 3 was used.

FIG. 9 is a diagram showing analysis results of a mass flow rate when the injector 300 of FIG. 3 was used. In FIG. 9, the horizontal axis represents the position of the gas hole 313, and the vertical axis represents the mass flow rate [arb.unit] of $Si_2H_6$. The position of the gas hole 313 indicates at which position the gas hole is arranged from the top side of the first upright portion 310.

As shown in FIG. 9, it can be seen that, even if the flow rate ratio X/Y is changed, the mass flow rate of $Si_2H_6$ hardly changes and is substantially constant at all positions in the vertical direction of the injector 300.

From the results of FIGS. 8 and 9 described above, it was shown that, by using the injector 300, it is possible to make the mass flow distribution of $Si_2H_6$ in the vertical direction substantially constant, and to shift the peak position of the thermal decomposition rate of $Si_2H_6$ in the vertical direction.

Furthermore, it was shown that by setting the inner diameter of the upright portion (the second upright portion 320) at the side where the gas holes 313 are not provided to be smaller than the inner diameter of the upright portion (the first upright portion 310) at the side where the gas holes 313 are provided, it is possible to make the waveform of the mole fraction of $SiH_2$ have symmetry.

(Analysis C)

Next, using the injector 200 of FIG. 2, the mole fraction of $SiH_2$ and the mass flow rate of $Si_2H_6$ when the flow rate ratio of $Si_2H_6$ introduced into the injector 200 from the introduction ports 212 and 222 was changed were analyzed. In this analysis, the inner diameter of the injector 200 was set to 5.4 mm, the hole diameter of the gas holes 313 was set to 0.5 mm, the number of gas holes 313 was set to 61, and the total flow rate of $Si_2H_6$ was set to 500 sccm. In addition, the flow rate ratio X/Y of the flow rate X of $Si_2H_6$ introduced into the injector 200 from the introduction port 212 to the flow rate Y of $Si_2H_6$ introduced into the injector 200 from the introduction port 222 was changed as follows.

X/Y=490/10, 400/100, 300/200, 250/250, 200/300, 100/400, 10/490 (where, the unit is sccm for all values)

Figure 10:
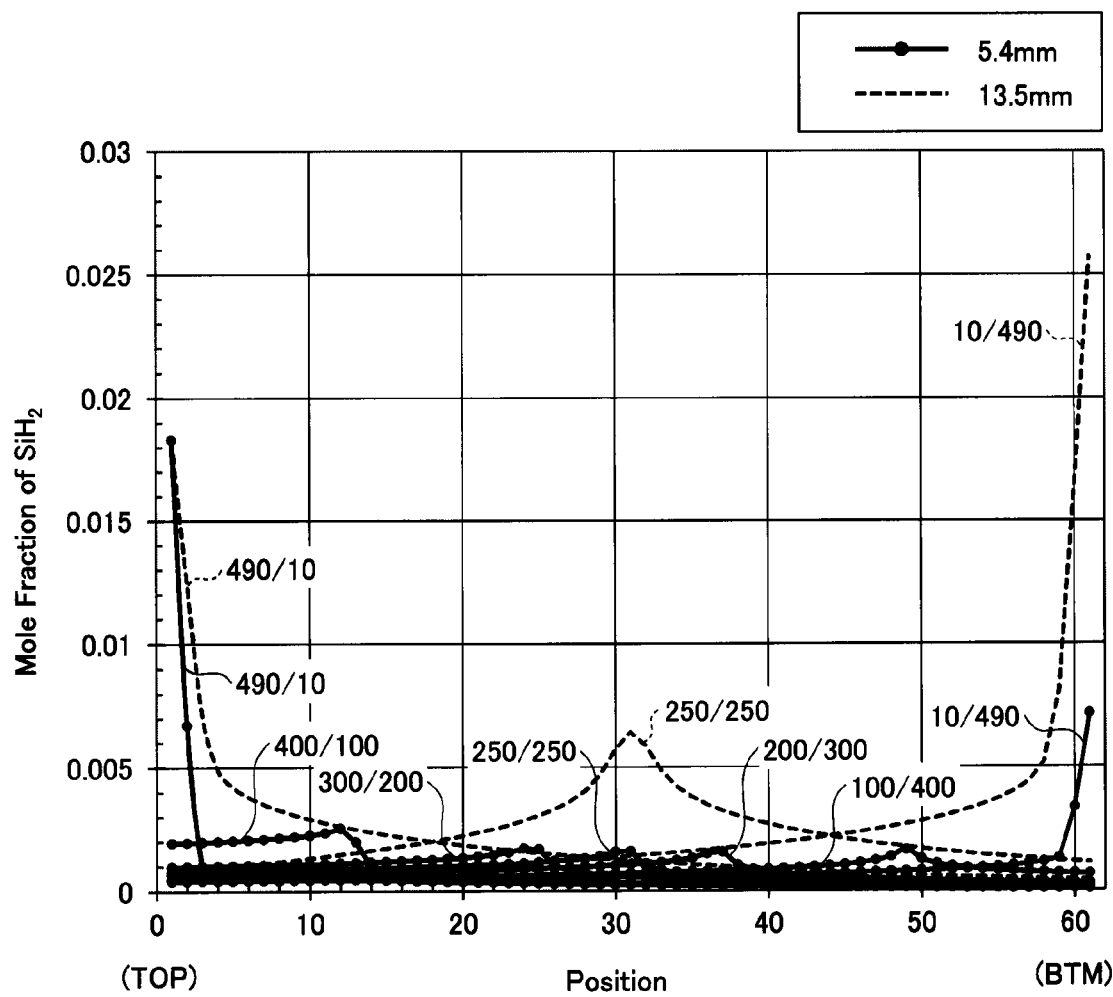
FIG. 10 is a diagram showing analysis results of the mole fraction of $SiH_2$ when the injector (inner diameter: 5.4 mm) of FIG. 2 was used.

FIG. 10 is a diagram showing analysis results of the mole fraction of $SiH_2$ when the injector 200 (inner diameter: 5.4 mm) of FIG. 2 was used. In FIG. 10, the horizontal axis represents the position of the gas hole 213, and the vertical axis represents the mole fraction of $SiH_2$. The position of the gas hole 213 indicates at which position the gas hole is arranged from the top side of the first upright portion 310. In addition, FIG. 10 also shows the analysis results of the mole fraction of $SiH_2$ when the injector 200 (inner diameter: 13.5 mm) of FIG. 2 was used for comparison. In FIG. 10, the results of the injector 200 (inner diameter: 5.4 mm) are indicated by solid lines, and the results of the injector 200 (inner diameter: 13.5 mm) are indicated by broken lines.

As shown in FIG. 10, it can be seen that the peak position of the mole fraction of $SiH_2$ is shifted when the flow rate ratio X/Y is changed. Specifically, it can be seen that as the flow rate ratio X/Y is made smaller, the peak position of the mole fraction of $SiH_2$ is shifted from the upper portion (TOP) to the lower portion (BTM) of the injector 200.

In addition, as shown in FIG. 10, it can be seen that, compared to the case where the injector 200 (inner diameter: 13.5 mm) was used, the mole fraction of $SiH_2$ becomes smaller as a whole when the injector 200 (inner diameter: 5.4 mm) was used. That is, it can be seen that, compared to the case where the injector 200 (inner diameter: 13.5 mm) was used, the thermal decomposition rate of $Si_2H_6$ is suppressed to be lower when the injector 200 (inner diameter: 5.4 mm) was used.

Figure 11:
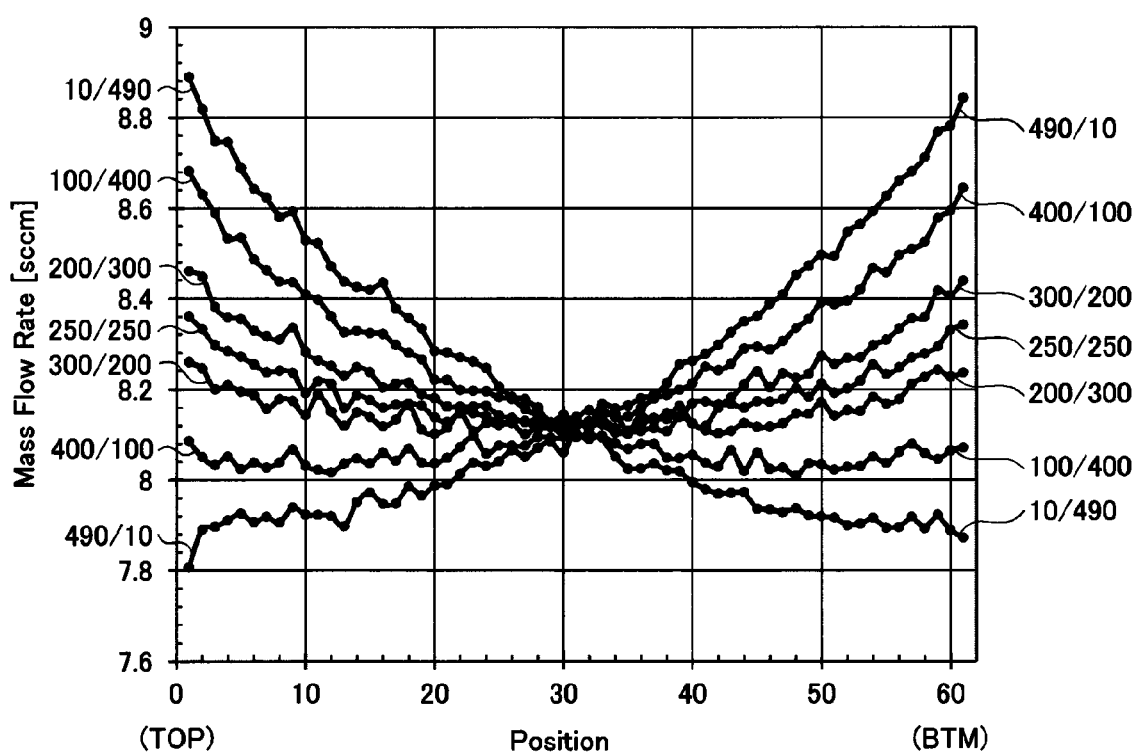
FIG. 11 is a diagram showing analysis results of a mass flow rate when the injector of FIG. 2 (inner diameter: 5.4 mm) was used.

FIG. 11 is a diagram showing analysis results of a mass flow rate when the injector 200 of FIG. 2 (inner diameter: 5.4 mm) was used. In FIG. 11, the horizontal axis represents the position of the gas hole 213, and the vertical axis represents the mass flow rate [sccm] of $Si_2H_6$. The position of the gas hole 213 indicates at which position the gas hole is arranged from the top side of the first upright portion 210.

As shown in FIG. 11, it can be seen that the distribution of mass flow rates of $Si_2H_6$ is changed significantly when the flow rate ratio X/Y is changed. Specifically, when the flow rate ratio X/Y is larger than 1, a distribution in which the mass flow rates of $Si_2H_6$ increase from the upper portion (TOP) toward the lower portion (BTM) of the injector 200 is shown. When the flow rate ratio X/Y is smaller than 1, a distribution in which the mass flow rates of $Si_2H_6$ decrease from the upper portion (TOP) toward the lower portion (BTM) of the injector 200 is shown. In addition, when the flow rate ratio X/Y is 1, a concave distribution in which the mass flow rate of $Si_2H_6$ at the position of the gas hole 213 provided at the center in the vertical direction is minimized is shown.

From the results of FIGS. 10 and 11 described above, it was shown that by reducing the inner diameter of the injector 200, it is possible to suppress the thermal decomposition rate of $Si_2H_6$ to be slightly lower so that a degree of change in the distribution of mass flow rates of $Si_2H_6$ in the vertical direction can be increased when the flow rate ratio X/Y is changed.

(Analysis D)

Next, using the injector 400 of FIG. 4, the mole fraction of $SiH_2$ and the mass flow rate of $Si_2H_6$ when the flow rate ratio of $Si_2H_6$ introduced into the injector 400 from the introduction ports 412 and 422 was changed were analyzed. In this analysis, the inner diameter of the injector 400 was set to 5.4 mm, the hole diameter of the gas holes 413 was set to 0.5 mm, and the total flow rate of $Si_2H_6$ was set to 500 sccm. In addition, the number of gas holes 413 provided in the first upright portion 410 was set to 31, and the number of gas holes 423 provided in the second upright portion 420 was set to 30. Furthermore, the flow rate ratio X/Y of the flow rate X of $Si_2H_6$ introduced into the injector 400 from the introduction port 412 to the flow rate Y of $Si_2H_6$ introduced into the injector 400 from the introduction port 422 was changed as follows.

X/Y=490/10, 250/250, 10/490 (where, the unit is sccm for all values)

Figure 12:
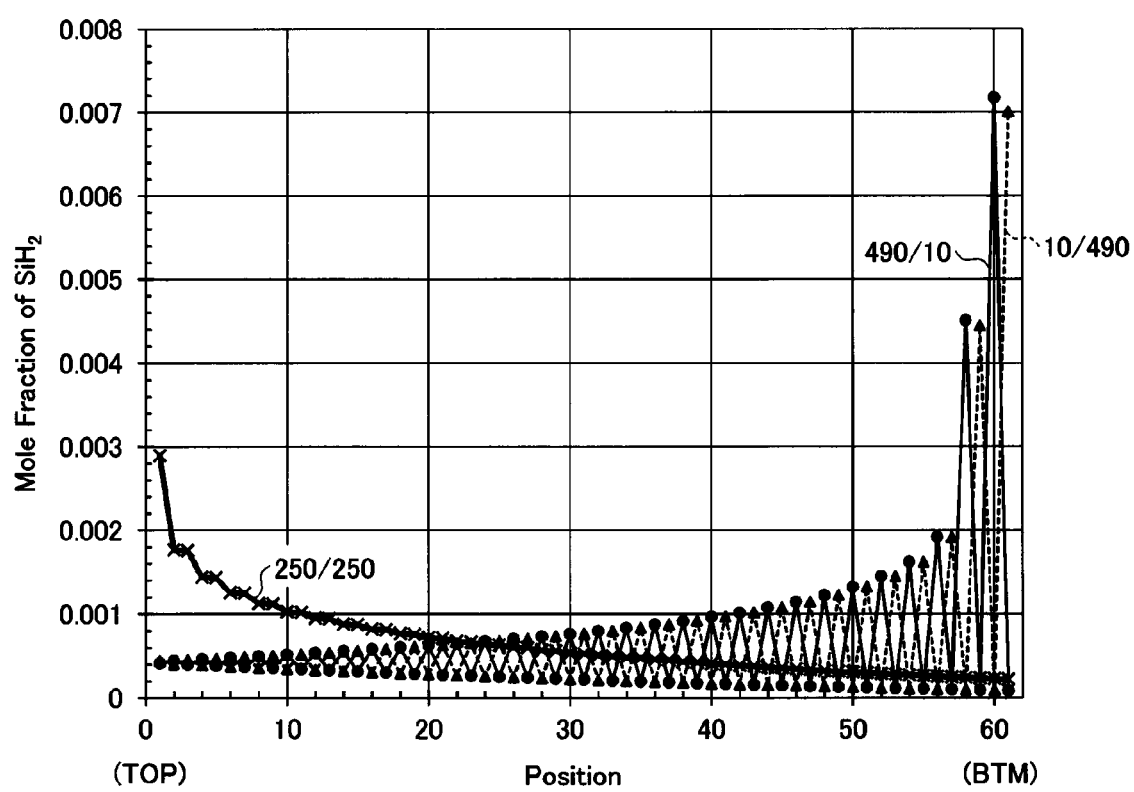
FIG. 12 is a diagram showing analysis results of the mole fraction of $SiH_2$ when the injector of FIG. 4 was used.

FIG. 12 is a diagram showing analysis results of the mole fraction of $SiH_2$ when the injector 400 of FIG. 4 was used. In FIG. 12, the horizontal axis represents the positions of the gas holes 413 and 423, and the vertical axis represents the mole fraction of $SiH_2$. The positions of the gas holes 413 and 423 indicate at which positions the gas holes are arranged from top sides of the first upright portion 410 and the second upright portion 420, respectively. For example, the position represented by "1" indicates the position of the gas hole 413 provided at the top of the first upright portion 410, and the position represented by "2" is the position of the gas hole 423 provided at the top of the second upright portion 420.

As shown in FIG. 12, it can be seen that the mole fractions of $SiH_2$ are small as a whole. That is, it can be seen that the thermal decomposition rate of $Si_2H_6$ is suppressed to be low as a whole. It is considered that this is because the inner diameter of the injector 400 is as small as 5.4 mm.

Figure 13:
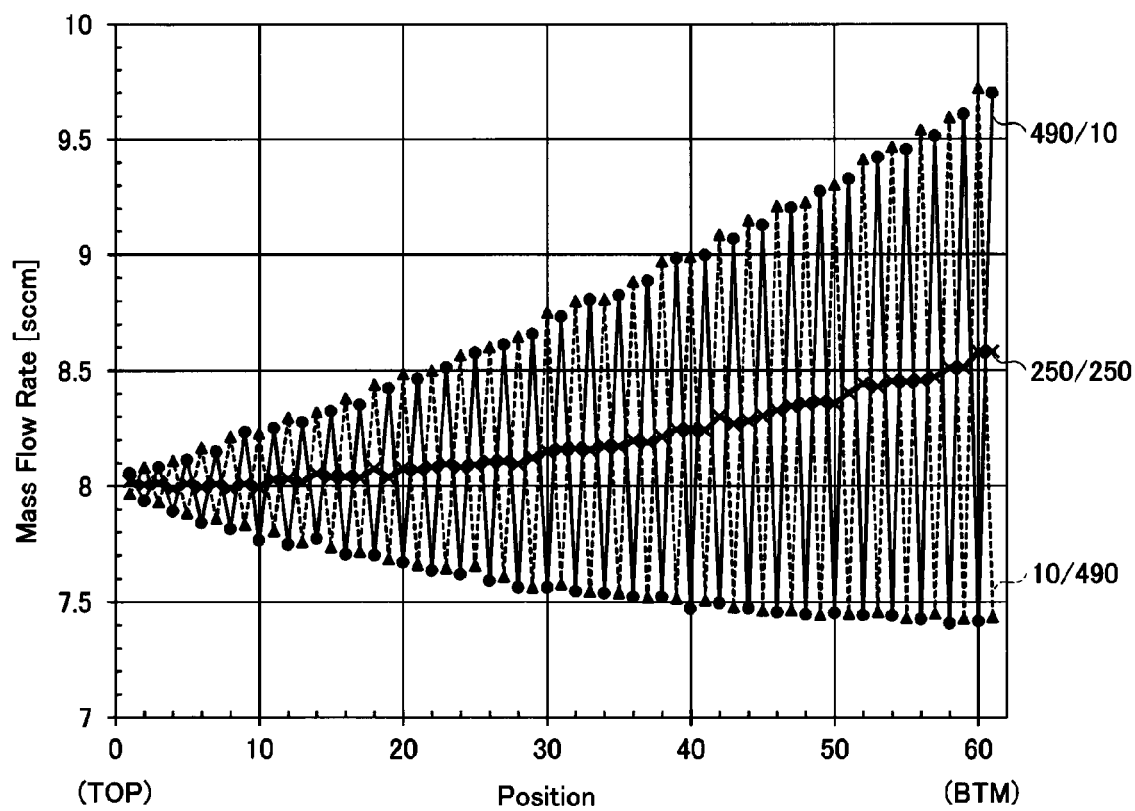
FIG. 13 is a diagram showing analysis results of a mass flow rate when the injector of FIG. 4 was used.

FIG. 13 is a diagram showing analysis results of a mass flow rate when the injector 400 of FIG. 4 was used. In FIG. 13, the horizontal axis represents the positions of the gas holes 413 and 423, and the vertical axis represents the mass flow rate [arb.unit] of $Si_2H_6$. The positions of the gas holes 413 and 423 indicate at which positions the gas holes are arranged from top sides of the first upright portion 410 and the second upright portion 420, respectively. For example, the position represented by "1" indicates the position of the gas hole 413 provided at the top of the first upright portion 410, and the position represented by "2" is the position of the gas hole 423 provided at the top of the second upright portion 420.

As shown in FIG. 13, it can be seen that the distribution of mass flow rates of $Si_2H_6$ is changed significantly when the flow rate ratio X/Y is changed.

From the results of FIGS. 12 and 13 described above, it was shown that the distribution of mass flow rates of $Si_2H_6$ in the vertical direction when the flow rate ratio X/Y is changed can be changed by using the injector 400.

(Analysis E)

Next, using the injector 300 of FIG. 3, the mole fraction of $SiH_2$ when $N_2$ was added to $Si_2H_6$ introduced into the injector 300 from the introduction ports 312 and 322 was analyzed. In this analysis, the inner diameter of the first upright portion 310 was set to 13.5 mm, the inner diameter of the second upright portion 320 was set to 5.4 mm, the hole diameter of the gas holes 313 was set to 0.5 mm, the number of gas holes 313 was set to 61, and the total flow rate of $Si_2H_6$ was set to 500 sccm. Furthermore, the flow rate ratio X/Y of the flow rate X of $Si_2H_6$ introduced into the injector 300 from the introduction port 312 to the flow rate Y of $Si_2H_6$ introduced into the injector 300 from the introduction port 322 was set as follows.

X/Y=490/10, 10/490 (where, the unit is sccm for all values)

In addition, $N_2$ was supplied as an additive gas from the introduction port 312 or 322 having a lower flow rate of $S_2H_6$ from among the flow rate X and the flow rate Y. The amount of $N_2$ added is as follows.

$N_2$=0.0, 0.1, 0.2, 0.3, 0.4, 0.5 (where, the unit is sccm for all values)

Figure 14:
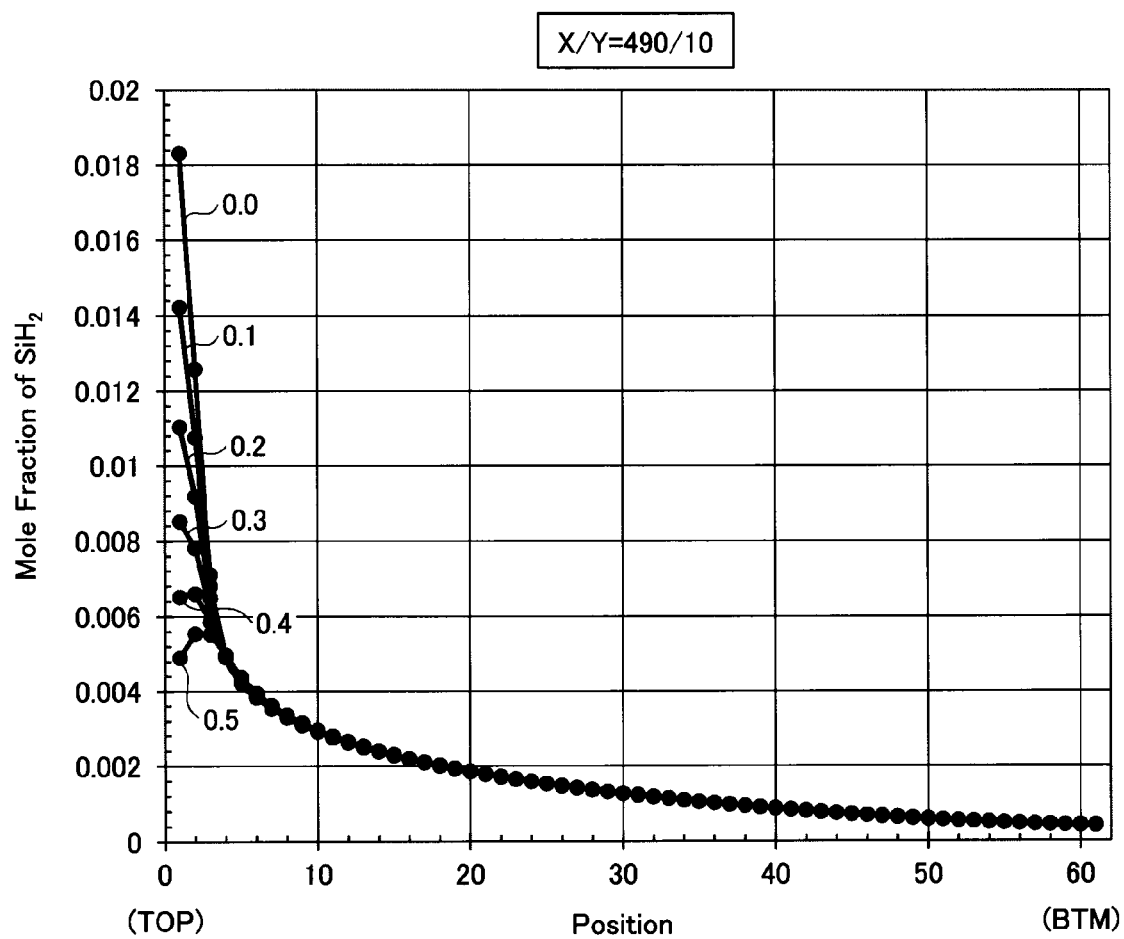
FIG. 14 is a diagram showing analysis results of a mole fraction of $SiH_2$ when $N_2$ was added to $Si_2H_6$.

FIG. 14 is a diagram showing analysis results of the mole fraction of $SiH_2$ when the injector 300 of FIG. 3 was used. FIG. 14 shows the results when the flow rate ratio X/Y was set to 490/10 and $N_2$ was supplied from the introduction port 322. In FIG. 14, the horizontal axis represents the position of the gas hole 313, and the vertical axis represents the mole fraction of $SiH_2$. The position of the gas hole 313 indicates at which position the gas hole is arranged from the top side of the first upright portion 310.

As shown in FIG. 14, it can be seen that the peak height of the mole fraction of $SiH_2$ changes when the added amount of $N_2$ is changed. Specifically, it can be seen that the peak height of the mole fraction of $SiH_2$ becomes smaller as the added amount of $N_2$ increases.

Figure 15:
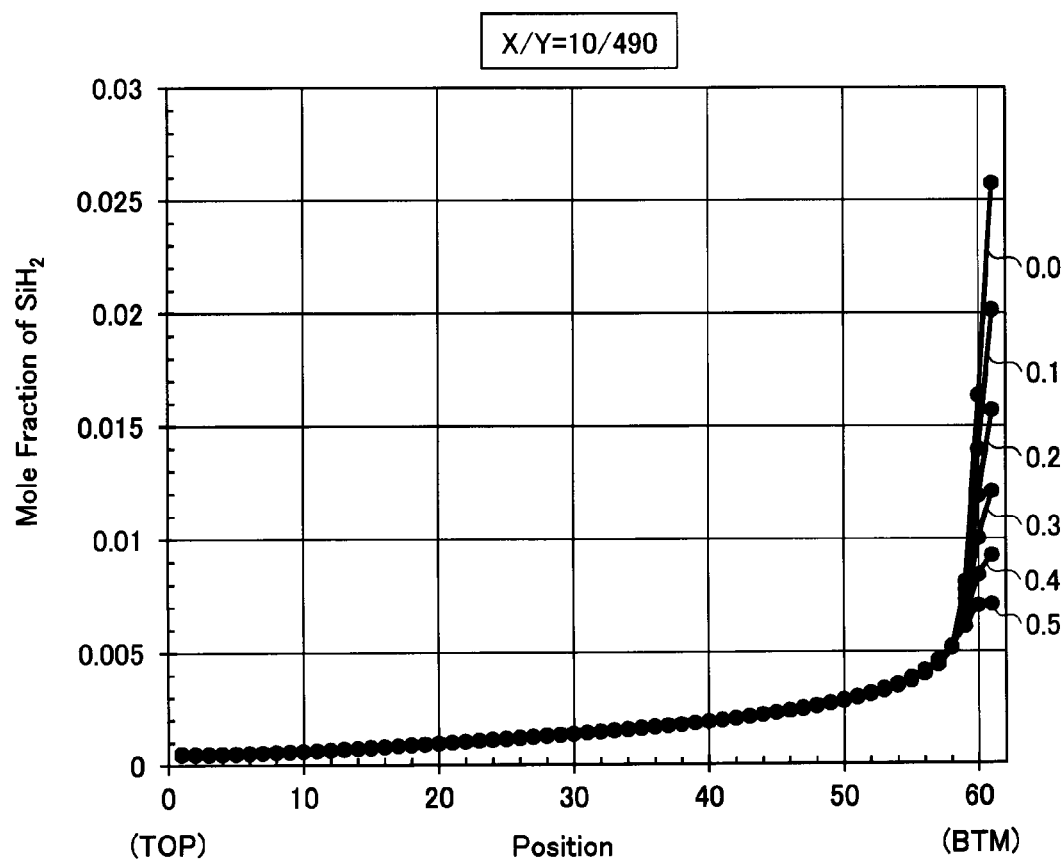
FIG. 15 is a diagram showing analysis results of a mole fraction of $SiH_2$ when $N_2$ was added to $Si_2H_6$.

FIG. 15 is a diagram showing analysis results of the mole fraction of $SiH_2$ when the injector 300 of FIG. 3 was used. FIG. 15 shows the results when the flow rate ratio X/Y was set to 10/490 and $N_2$ was supplied from the introduction port 312. In FIG. 15, the horizontal axis represents the position of the gas hole 313, and the vertical axis represents the mole fraction of $SiH_2$. The position of the gas hole 313 indicates at which position the gas hole is arranged from the top side of the first upright portion 310.

As shown in FIG. 15, it can be seen that the peak height of the mole fraction of $SiH_2$ changes when the added amount of $N_2$ is changed. Specifically, it can be seen that the peak height of the mole fraction of $SiH_2$ becomes smaller as the added amount of $N_2$ increases.

From the results of FIGS. 14 and 15 described above, it was shown that, when the difference between the flow rate X and the flow rate Y is large, it is possible to suppress the peak height of the mole fraction of $Si_2H_6$ by introducing $N_2$ into the injector 300 from the introduction port 312 or 322 having the smaller flow rate of $Si_2H_6$. That is, it was shown that, when the difference between the flow rate X and the flow rate Y is large, it is possible to suppress the thermal decomposition rate of $Si_2H_6$ from increasing extremely at the peak position by introducing $N_2$ into the injector 300 from the introduction port 312 or 322 having the smaller flow rate of $Si_2H_6$.

(Analysis F)

Next, using the injector 200 of FIG. 2, the mole fraction of $SiH_2$ when the total flow rate of $Si_2H_6$ introduced into the injector 200 from the introduction ports 212 and 222 was changed was analyzed. In this analysis, the inner diameter of the injector 200 was set to 5.4 mm, the hole diameter of the gas holes 213 was set to 0.5 mm, the number of gas holes 213 was set to 61, and the total flow rate of $Si_2H_6$ was set to 700 sccm, 300 sccm, and 100 sccm. Furthermore, the flow rate ratio X/Y of the flow rate X of $Si_2H_6$ introduced into the injector 200 from the introduction port 212 to the flow rate Y of $Si_2H_6$ introduced into the injector 200 from the introduction port 222 was set as follows.

X/Y=630/70, 350/350, 70/630 (where, the unit is sccm for all values)

X/Y=270/30, 150/150, 30/270 (where, the unit is sccm for all values)

X/Y=90/10, 50/50, 10/90 (where, the unit is sccm for all values)

Figure 16:
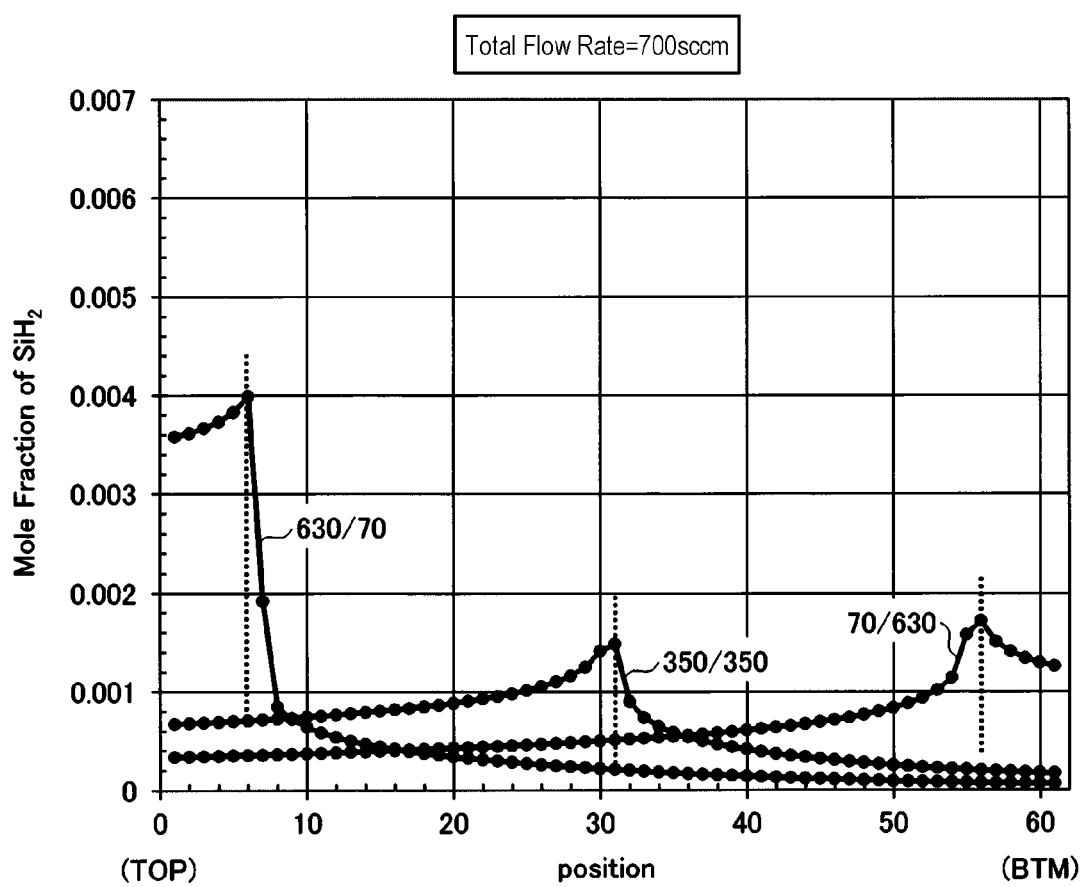
FIG. 16 is a diagram showing analysis results of the mole fraction of $SiH_2$ when the total flow rate of $Si_2H_6$ was changed.
Figure 17:
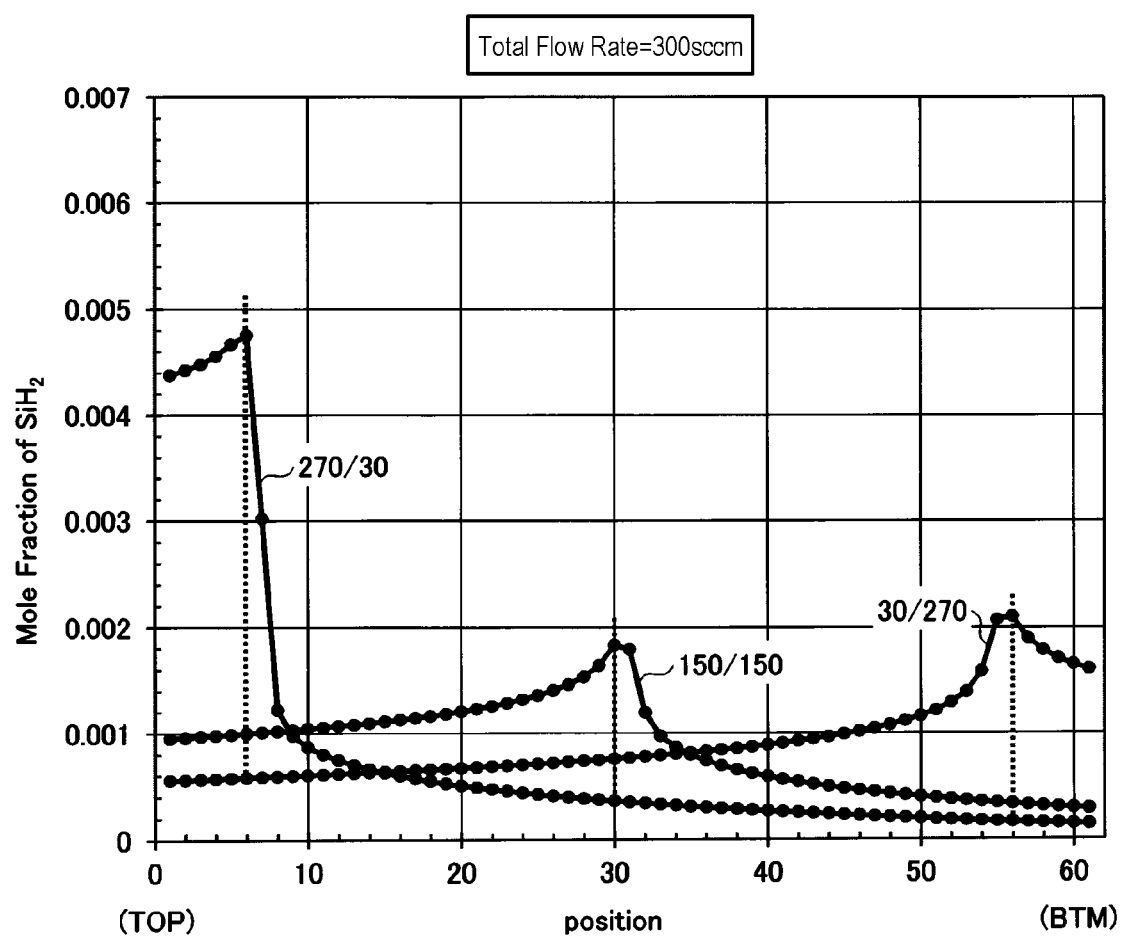
FIG. 17 is a diagram showing analysis results of the mole fraction of $SiH_2$ when the hole diameter of the gas holes was changed.
Figure 18:
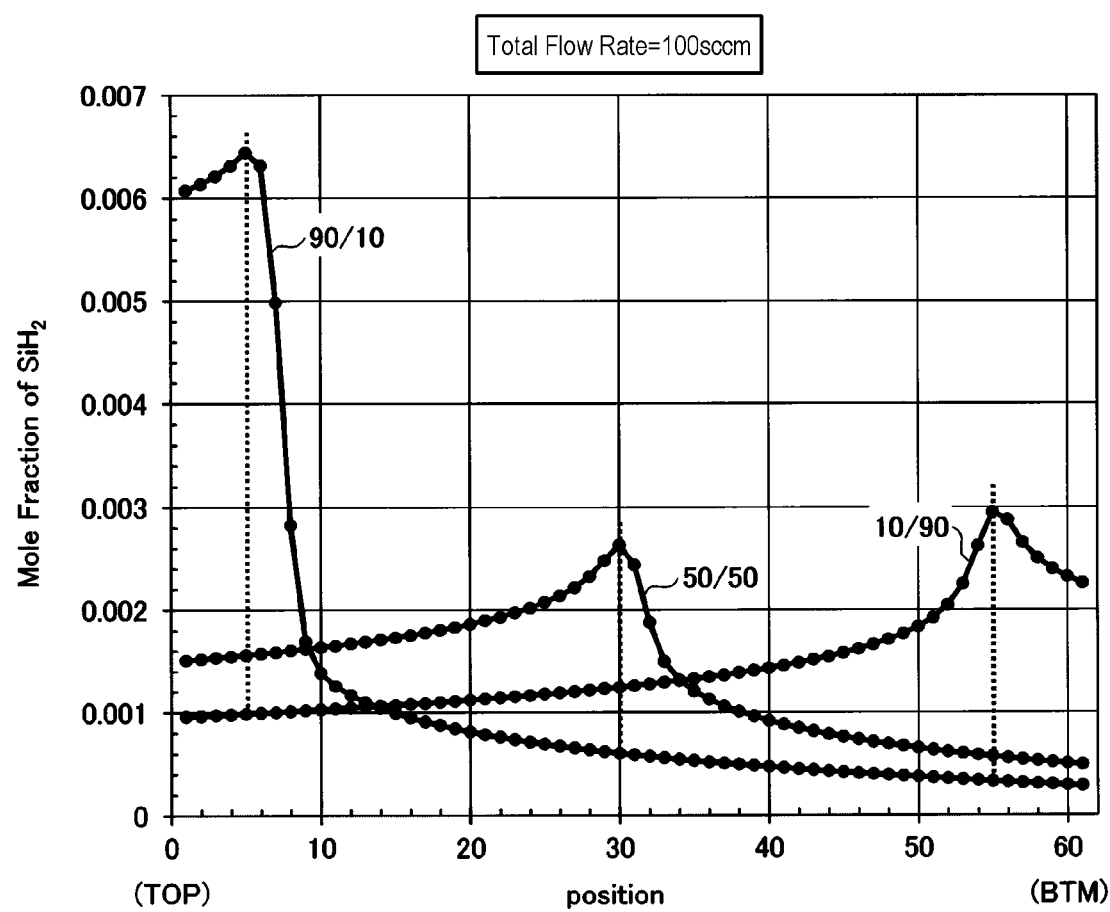
FIG. 18 is a diagram showing analysis results of the mole fraction of $SiH_2$ when the hole diameter of the gas holes was changed.

FIGS. 16 to 18 are diagrams showing the analysis results of the mole fraction of $SiH_2$ when the total flow rate of $Si_2H_6$ was changed. FIGS. 16, 17, and 18 show the results when the total flow rate of $Si_2H_6$ is set to 700 sccm, 300 sccm, and 100 sccm, respectively. In each of FIGS. 16 to 18, the horizontal axis represents the position of the gas hole 213, and the vertical axis represents the mole fraction of $SiH_2$. The position of the gas hole 213 indicates at which position the gas hole is arranged from the top side of the first upright portion 210.

As shown in FIGS. 16 to 18, regardless of whether the total flow rate of $Si_2H_6$ is set to 700 sccm, 300 sccm, or 100 sccm, it can be seen that, when the flow rate ratio X/Y is changed, the peak position of the mole fraction of $SiH_2$ is shifted with the same tendency. Specifically, it can be seen that as the flow rate ratio X/Y is made smaller, the peak position of the mole fraction of $SiH_2$ is shifted from the upper portion (TOP) to the lower portion (BTM) of the injector 200.

From the results of FIGS. 16 to 18 described above, it was shown that the results have robustness with respect to the total flow rates.

(Analysis G)

Next, using the injector 200 of FIG. 2, the mole fraction of $SiH_2$ when the hole diameter of the gas holes 213 was changed was analyzed. In this analysis, the inner diameter of the injector 200 was set to 5.4 mm, the hole diameter of the gas holes 213 was set to 0.7 mm or 0.5 mm, the number of gas holes 213 was set to 61, and the total flow rate of $Si_2H_6$ was set to 500 sccm. Furthermore, the flow rate ratio X/Y of the flow rate X of $Si_2H_6$ introduced into the injector 200 from the introduction port 212 to the flow rate Y of $Si_2H_6$ introduced into the injector 200 from the introduction port 222 was set as follows.

X/Y=450/50, 250/250, 50/450 (where, the unit is sccm for all values)

Figure 19:
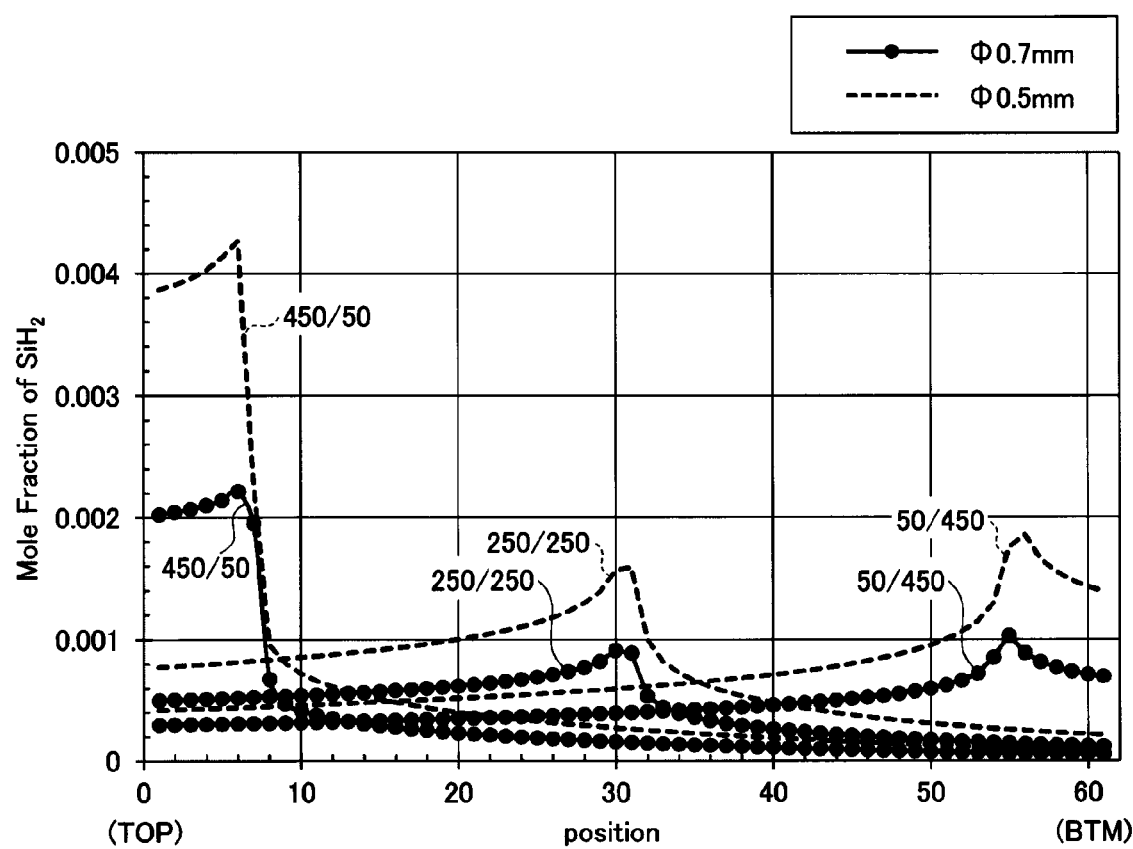
FIG. 19 is a diagram showing analysis results of the mole fraction of $SiH_2$ when the hole diameter of the gas holes was changed.

FIG. 19 is a diagram showing analysis results of the mole fraction of $SiH_2$ when the hole diameter of the gas holes was changed. In FIG. 19, the horizontal axis represents the position of the gas hole 213, and the vertical axis represents the mole fraction of $SiH_2$. The position of the gas hole 213 indicates at which position the gas hole is arranged from the top side of the first upright portion 210.

As shown in FIG. 19, it can be seen that, regardless of whether the gas hole diameter is 0.7 mm or 0.5 mm, when the flow rate ratio X/Y is changed, the peak position of the mole fraction of $SiH_2$ is shifted with the same tendency. Specifically, it can be seen that as the flow rate ratio X/Y is made smaller, the peak position of the mole fraction of $SiH_2$ is shifted from the upper portion (TOP) to the lower portion (BTM) of the injector 200.

From the results of FIG. 19 described above, it was shown that the results have robustness with respect to the hole diameters of the gas holes.

In the above embodiments, the introduction ports 212, 312, 421, and 512 are examples of the first introduction port, the introduction ports 222, 322, 422, and 522 are examples of the second introduction port, and the introduction port 532 is an example of the third introduction port.

According to the present disclosure, the inter-plane uniformity of gas supply to substrates can be adjusted.

It should be understood that the embodiments disclosed herein are exemplary in all respects and are not restrictive. The above-described embodiments may be omitted, replaced, or modified in various forms without departing from the scope and spirit of the appended claims.

What is claimed is:

1. A processing apparatus comprising:
   a processing container having a substantially cylindrical shape;
   an injector provided to extend in a longitudinal direction along an inner side of an inner wall of the processing container and including:
     a first upright portion and a second upright portion provided to extend in the longitudinal direction along the inner side of the inner wall of the processing container and connected to each other at upper portions thereof;
     a plurality of introduction ports, into which a processing gas is introduced, including a first introduction port provided in a lower portion of the first upright portion and a second introduction port provided in a lower portion of the second upright portion;
     and a plurality of gas holes from which the processing gas introduced from the plurality of introduction ports is ejected into the processing container;
   and a controller configured to flow processing gas into the first introduction port and the second introduction port and to change a flow rate ratio of the processing gas that is introduced into the first upright portion from the first introduction port to the processing gas that is introduced into the second upright portion from the second introduction port.

2. The processing apparatus of claim 1, wherein the plurality of gas holes are provided in one of the first upright portion and the second upright portion.

3. The processing apparatus of claim 2, wherein the plurality of gas holes are provided in the first upright portion, and
   the second upright portion has an inner diameter smaller than an inner diameter of the first upright portion.

4. The processing apparatus of claim 3, wherein the injector includes a third upright portion connected to a middle of the first upright portion, and
   the plurality of introduction ports include a third introduction port provided in a lower portion of the third upright portion.

5. The processing apparatus of claim 4, wherein the processing container is configured to accommodate a plurality of substrates substantially horizontally at an interval in the longitudinal direction.

6. The processing apparatus of claim 5, wherein the plurality of introduction ports are connected to a single processing gas source.

7. The processing apparatus of claim 6, wherein the processing gas includes a raw-material gas that deposits a film on the plurality of substrates.

8. The processing apparatus of claim 7, wherein the processing gas includes an inert gas.

9. The processing apparatus of claim 8, wherein the controller is configured to further change the flow rate ratio during a film forming process of depositing a film on a plurality of substrates.

10. The processing apparatus of claim 1, wherein the processing container is configured to accommodate a plurality of substrates substantially horizontally at an interval in the longitudinal direction.

11. The processing apparatus of claim 1, wherein the plurality of introduction ports are connected to a single processing gas source.

12. The processing apparatus of claim 1, wherein the controller is configured to further change the flow rate ratio during a film forming process of depositing a film on a plurality of substrates.

13. A processing method of performing a process on substrates in a processing apparatus that includes: a processing container having a substantially cylindrical shape; and an injector provided to extend in a longitudinal direction along an inner side of an inner wall of the processing container and including:
   a first upright portion and a second upright portion provided to extend in the longitudinal direction along the inner side of the inner wall of the processing container and connected to each other at upper portions thereof;
   a plurality of introduction ports, into which a processing gas is introduced, including a first introduction port provided in a lower portion of the first upright portion and a second introduction port provided in a lower portion of the second upright portion; and
   a plurality of gas holes from which the processing gas introduced from the plurality of introduction ports is ejected into the processing container, the processing method comprising:
   flowing processing gas into the first introduction port and the second introduction port, and
   changing a flow rate ratio of the processing gas that is introduced into the first upright portion from the first introduction port to the processing gas that is introduced into the second upright portion from the second introduction port while performing the process on the substrates.

* * * * *